United States Patent
Jeong et al.

(10) Patent No.: US 11,881,860 B2
(45) Date of Patent: Jan. 23, 2024

(54) PHASE MIXING CIRCUIT AND MULTI-PHASE CLOCK SIGNAL ALIGNMENT CIRCUIT INCLUDING THE SAME

(71) Applicants: SK hynix Inc., Icheon (KR); Seoul National University R&DB Foundation, Seoul (KR)

(72) Inventors: Shin-Hyun Jeong, Seoul (KR); Yongun Jeong, Seoul (KR); Suhwan Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 18/056,676

(22) Filed: Nov. 17, 2022

(65) Prior Publication Data

US 2023/0403000 A1    Dec. 14, 2023

(30) Foreign Application Priority Data

Jun. 9, 2022   (KR) .......................... 10-2022-0070211

(51) Int. Cl.
*H03K 5/00* (2006.01)
*H03K 5/01* (2006.01)
*H03K 19/20* (2006.01)

(52) U.S. Cl.
CPC ............... *H03K 5/01* (2013.01); *H03K 19/20* (2013.01); *H03K 2005/00019* (2013.01); *H03K 2005/00286* (2013.01)

(58) Field of Classification Search
CPC ...................... H03K 5/01; H03K 19/20; H03K 2005/00019; H03K 2005/00286

USPC .......................................................... 327/146
See application file for complete search history.

(56) References Cited

U.S. PATENT DOCUMENTS

| | | | |
|---|---|---|---|
| 7,009,436 B2 | 3/2006 | Huang et al. | |
| 8,384,458 B1* | 2/2013 | Huang | H03K 5/131 327/175 |
| 9,197,202 B2* | 11/2015 | Jang | H03K 5/131 |
| 9,667,252 B1* | 5/2017 | Lee | H03K 5/1565 |
| 11,264,994 B1* | 3/2022 | Kim | H03L 7/0818 |
| 11,483,004 B2* | 10/2022 | Park | H03L 7/0816 |
| 2005/0024117 A1* | 2/2005 | Kubo | H03K 17/693 327/258 |
| 2007/0182472 A1* | 8/2007 | Cho | H03L 7/0814 327/158 |
| 2008/0174350 A1* | 7/2008 | Shin | H03L 7/0816 327/158 |

(Continued)

OTHER PUBLICATIONS

K. Ryu et al., "Process-Variation-Calibrated Multiphase Delay Locked Loop With a Loop-Embedded Duty Cycle Corrector," in IEEE Transactions on Circuits and Systems II: Express Briefs, vol. 61, No. 1, pp. 1-5, Jan. 2014, doi: 10.1109/TCSII.2013.2291052.

(Continued)

*Primary Examiner* — Ryan Jager

(57) ABSTRACT

A phase mixing circuit for a multi-phase signal includes a jitter cancellation circuit configured to mix phases of a signal input to a first node and a signal input to a second node to produce signals at a third node and a fourth node; and a delay adjustment circuit configured to adjust delays of the signals output from the third node and the fourth node to produce signals at a fifth node and a sixth node.

14 Claims, 8 Drawing Sheets

(56) References Cited

U.S. PATENT DOCUMENTS

| | | | | |
|---|---|---|---|---|
| 2009/0289676 | A1* | 11/2009 | Takai | H03L 7/0818 327/158 |
| 2010/0315147 | A1* | 12/2010 | Booth | H03K 5/13 327/298 |
| 2021/0217457 | A1* | 7/2021 | Satoh | H03L 7/0814 |
| 2022/0094339 | A1* | 3/2022 | Kim | H03L 7/0814 |
| 2022/0123755 | A1* | 4/2022 | Park | H03L 7/085 |

OTHER PUBLICATIONS

Y. Kim et al., "A 2.3-mW 0.01-mm2 1.25-GHz Quadrature Signal Corrector With 1.1-ps Error for Mobile DRAM Interface in 65-nm CMOS," in IEEE Transactions on Circuits and Systems II: Express Briefs, vol. 64, No. 4, pp. 397-401, Apr. 2017, doi: 10.1109/TCSII.2016.2569441.

J.-H. Chae et al., "A Quadrature Clock Corrector for DRAM Interfaces, With a Duty-Cycle and Quadrature Phase Detector Based on a Relaxation Oscillator," in IEEE Transactions on Very Large Scale Integration (VLSI) Systems, vol. 27, No. 4, pp. 978-982, Apr. 2019, doi:10.1109/TVLSI.2018.2883730.

S. Shin, et al., "A 0.8-to-2.3GHz Quadrature Error Corrector with Correctable Error Range of 101.6ps Using Minimum Total Delay Tracking and Asynchronous Calibration On-Off Scheme for DRAM Interface," 2020 IEEE International Solid-State Circuits Conference—(ISSCC), 2020, pp. 340-342, doi: 10.1109/ISSCC19947.2020.9063096.

H. Ko et al., "A 3.2 GHz Quadrature Error Corrector for DRAM Transmitters, Using Replica Serializers and Pulse-Shrinking Delay Lines," in IEEE Solid-State Circuits Letters, vol. 3, pp. 38-41, 2020, doi: 10.1109/LSSC.2020.2971569.

K. Niitsu et al., "A Clock Jitter Reduction Circuit Using Gated Phase Blending Between Self-Delayed Clock Edges," 2012 Symposium on VLSI Circuits (VLSIC), 2012, pp. 142-143, doi: 10.1109/VLSIC.2012.6243830.

K. Niitsu et al., "CMOS Circuits to Measure Timing Jitter Using a Self-Referenced Clock and a Cascaded Time Difference Amplifier With Duty-Cycle Compensation," in IEEE Journal of Solid-State Circuits, vol. 47, No. 11, pp. 2701-2710, Nov. 2012, doi: 10.1109/JSSC.2012.2211655.

* cited by examiner

PHASE MIXING CIRCUIT AND MULTI-PHASE CLOCK SIGNAL ALIGNMENT CIRCUIT INCLUDING THE SAME

CROSS-REFERENCE TO RELATED APPLICATIONS

The present application claims priority under 35 U.S.C. § 119(a) to Korean Patent Application No. 10-2022-0070211, filed on Jun. 9, 2022, which is incorporated herein by reference in its entirety.

BACKGROUND

1. Technical Field

Embodiments relate to a phase mixing circuit for mixing phases of a clock signal while canceling jitter and skew, and a multi-phase clock signal alignment circuit including the same.

2. Related Art

A double data rate 5 (DDR5) memory device uses high-speed 4-phase clock signals for high-speed data transmission.

For high-speed clock signals, as the distance from an output terminal of a clock generating circuit such as a phase locked loop (PLL) increases, the quality of the signal decreases and jitter and skew in the signal increase.

To remove the jitter or skew present in the multi-phase clock signal, a multi-phase clock signal alignment circuit based on a delay locked loop (DLL) may be used.

However, using the multi-phase clock signal alignment circuit to remove skew between the multi-phase clock signals may increase the jitter in those signals.

SUMMARY

In accordance with an embodiment of the present disclosure, a phase mixing circuit may include a jitter cancellation circuit configured to mix phases of a first signal input to a first node and a second signal input to a second node to produce a third signal at a third node and a fourth signal at a fourth node; and a delay adjustment circuit configured to adjust respective delays of the third signal and the fourth signal to produce a fifth signal at a fifth node and a sixth signal at a sixth node.

In accordance with an embodiment of the present disclosure, a multi-phase clock signal alignment circuit may include a plurality of phase delay circuits configured to control delays of a plurality of multi-phase input clock signals to produce a plurality of multi-phase clock signals, respectively; a plurality of phase mixing circuits configured to mix phases of the multi-phase clock signals to produce multi-phase output clock signals; a clock selection circuit configured to select alpha and beta clock signals from among the multi-phase clock signals or from among the multi-phase output clock signals; a first clock delay circuit configurable to provide a first selection clock signal by outputting the alpha clock signal and configurable to provide the first selection clock signal by adjusting a delay, a phase, or both of the alpha clock signal; a second clock delay circuit configurable to provide a second selection clock signal by outputting the beta clock signal and configurable to provide the second selection clock signal by adjusting a delay, a phase, or both of the beta clock signal; a phase detection circuit configured to detect phase difference between the first selection clock signal and the second selection clock signal; and a phase control circuit configured to control the delays of the plurality of the phase delay circuits according to an output of the phase detection circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Hereinafter, the present embodiment is disclosed by taking a circuit for aligning 4-phase clock signals as an example, but embodiments are not limited thereto.

Figure 1:
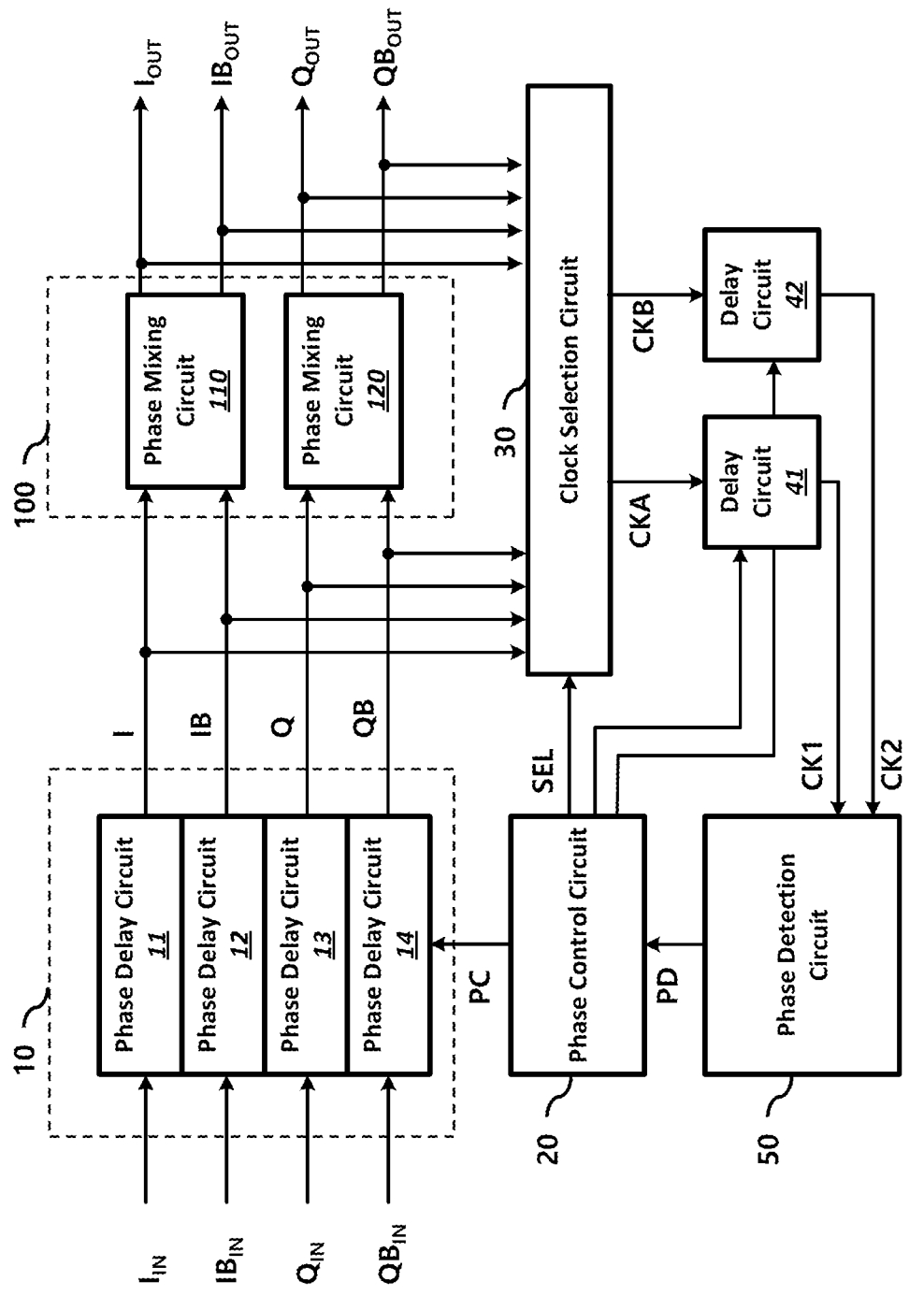
FIG. 1 illustrates a multi-phase clock signal alignment circuit according to an embodiment of the present disclosure.

FIG. 1 is a block diagram showing a multi-phase clock signal alignment circuit 1 according to an embodiment of the present disclosure.

The multi-phase clock signal alignment circuit 1 includes a plurality of phase delay circuits 10 respectively configured to delay multi-phase input clock signals $I_{IN}$, $IB_{IN}$, $Q_{IN}$, and $QB_{IN}$ to produce multi-phase clock signals I, IB, Q, and QB, and a plurality of phase mixing circuits 100 that mix phases of the multi-phase clock signals I, IB, Q, and QB to generate the multi-phase output clock signals $I_{OUT}$, $IB_{OUT}$, $Q_{OUT}$, and $QB_{OUT}$.

I, IB, Q, and QB are conventional symbols used to represent four-phase clock signals, and detailed descriptions of each will be omitted.

Hereinafter, I is referred to as a first clock signal, IB is referred to as a second clock signal, Q is referred to as a third clock signal, and QB is referred to as a fourth clock signal.

Accordingly, among the multi-phase clock signals, $I_{IN}$ is referred to as a first input clock signal, $IB_{IN}$ is referred to as a second input clock signal, $Q_{IN}$ is referred to as a third input clock signal, and $QB_{IN}$ is referred to as a fourth input clock signal.

Also, among the multi-phase output clock signals, $I_{OUT}$ is referred to as a first output clock signal, $IB_{OUT}$ is referred to as a second output clock signal, $Q_{OUT}$ is referred to as a third output clock signal, and $QB_{OUT}$ is referred to as a fourth output clock signal.

Each of the plurality of phase delay circuits 10 delays a corresponding multi-phase input clock signal according to respective values of a phase control signal PC to output a multi-phase clock signal.

A phase delay circuit 11 delays the first input clock signal $I_{IN}$ to produce the first clock signal I, and a phase delay circuit 12 delays the second input clock signal $IB_{IN}$ to produce the second clock signal IB, a phase delay circuit 13 delays the third input clock signal $Q_{IN}$ to produce the third clock signal Q, and the phase delay circuit 14 outputs the fourth input clock signal $QB_{IN}$ to produce the fourth clock signal QB.

Each of the phase delay circuits 11, 12, 13, and 14 may independently control delay amounts of a rising edge and a falling edge of the corresponding input clock signal.

An example of a phase delay circuit such as may be included in embodiments of the phase delay circuits 11, 12, 13, and 14 is disclosed in an article [Chae, Joo-Hyung et al. "A Quadrature Clock Corrector for DRAM Interfaces, With a Duty-Cycle and Quadrature Phase Detector Based on a Relaxation Oscillator." IEEE Transactions on Very Large Scale Integration (VLSI) Systems 27 (2019): 978-982.] and includes an even number of inverter circuits connected in series.

In such embodiments, the delay amount of a rising edge of the input clock signal may be adjusted by controlling the pull-up speed of one or more of the inverters, and delay amount of a falling edge of the input clock signal may be adjusted by controlling the pull-down speed of one or more of the inverters.

Each of the plurality of phase mixing circuits 100 produces two multi-phase output clock signals by mixing two multi-phase clock signals having opposite phases.

A phase mixing circuit 110 produces a first output clock signal $I_{OUT}$ and a second output clock signal $IB_{OUT}$ by mixing the first clock signal I and the second clock signal IB, and a phase mixing circuit 120 produces a third output clock signal $Q_{OUT}$ and a fourth output clock signal $QB_{OUT}$ by mixing the third clock signal Q and the fourth clock signal QB.

The multi-phase clock signal alignment circuit 1 further includes a phase control circuit 20, a clock selection circuit 30, delay circuits 41 and 42, and a phase detection circuit 50.

The phase control circuit 20 generates a phase control signal PC according to a phase detection signal PD, and adjusts delay amounts of each of the plurality of phase delay circuits 10 accordingly.

The clock selection circuit 30 selects, according to a selection signal SEL provided by the phase control circuit 20, alpha and beta clock signals CKA and CKB from among the multi-phase clock signals I, IB, Q, and QB or from among the multi-phase output clock signals $I_{OUT}$, $IB_{OUT}$, $Q_{OUT}$, and $QB_{OUT}$.

The delay circuit 41 may output the alpha clock signal CKA as it is, output a clock signal corresponding to an inversion of the alpha clock signal CKA, or output a clock signal corresponding to a delay of the alpha clock signal CKA by a predetermined time according to the control of the phase control circuit 20.

The delay circuit 42 may output the beta clock signal CKB as it is, output a clock signal corresponding to an inversion of the beta clock signal CKB, or output a clock signal corresponding to a delay of the beta clock signal CKB by a predetermined time according to the control of the phase control circuit 20.

The output from the delay circuit 41 is referred to as a first selection clock signal CK1, and the output from the delay circuit 42 is referred to as a second selection clock signal CK2.

The phase detection circuit 50 generates a phase detection signal PD by detecting a phase difference between the first and second selection clock signals CK1 and CK2.

For example, the phase detection circuit 50 may detect a phase difference between rising edges of the first selection clock signal CK1 and the second selection clock signal CK2 or a phase difference between falling edges of the first selection clock signal CK1 and the second selection clock signal CK2.

A technique for detecting phase difference of two selected clock signals and adjusting delay amounts of a delay control circuit using the phase difference is known by an article [Y. Kim, K. Song, D. Kim and S. Cho, "A 2.3-mW 0.01-mm2 1.25-GHz Quadrature Signal Corrector With 1.1-ps Error for Mobile DRAM Interface in 65-nm CMOS," in IEEE Transactions on Circuits and Systems II: Express Briefs, vol. 64, no. 4, pp. 397-411, April 2017, doi: 10.1109/TCSII.2016.2569441.], and various design changes are possible.

Accordingly, a detailed description of a method of generating a delay control signal using a result of a phase difference in the phase detection circuit 50 will be omitted.

In the illustrated example, the multi-phase input clock signals $I_{IN}$, $IB_{IN}$, $Q_{IN}$, and $QB_{IN}$ are high-speed signals and may be provided by a clock generation circuit such as a PLL.

Conventional multi-phase clock signal alignment circuit can reduce skew between the multi-phase input clock signals, but cannot reduce jitter. Furthermore, when skew is removed by a conventional multi-phase clock signal alignment circuit, jitter may be increased.

In contrast, the multi-phase clock signal alignment circuit 1 of the present embodiment includes a plurality of phase mixing circuits 100, where jitter is reduced.

Figure 2:
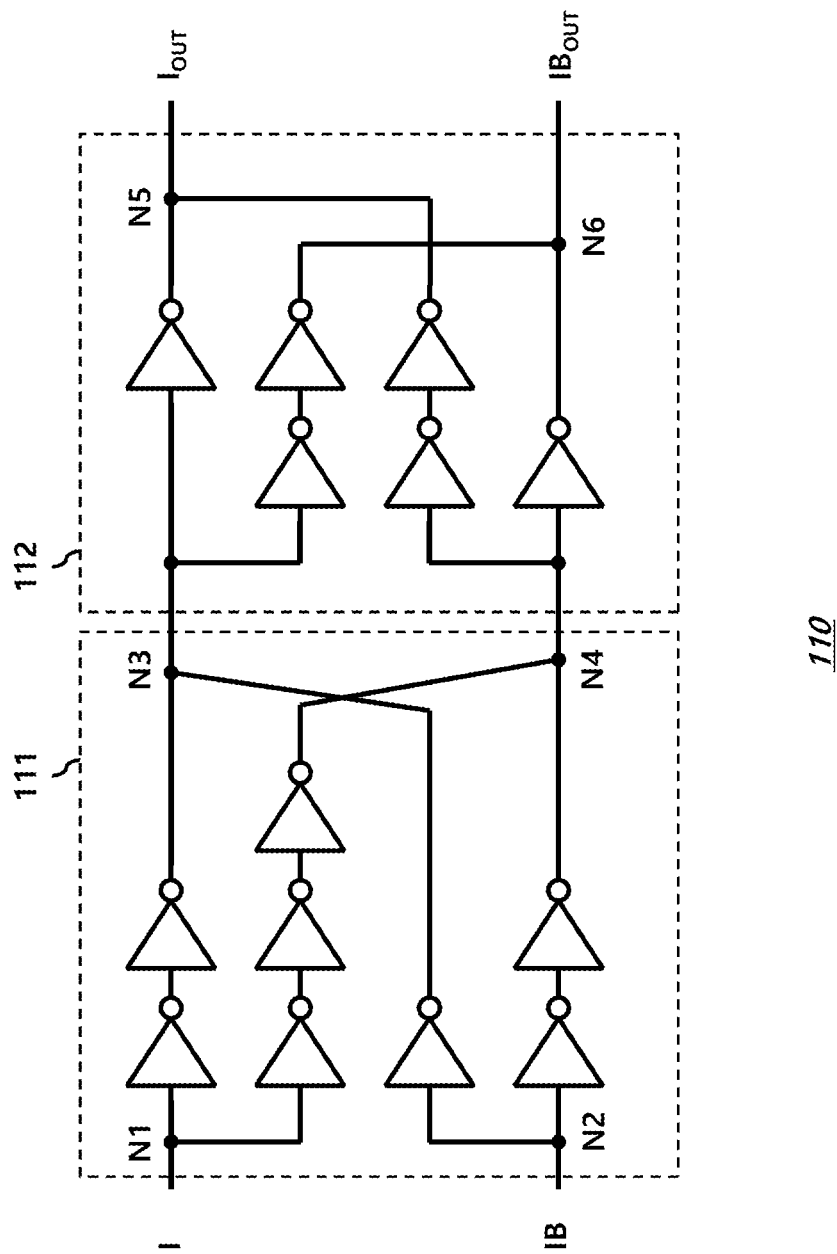
FIG. 2 illustrates a phase mixing circuit according to an embodiment of the present disclosure.

FIG. 2 is a circuit diagram illustrating the phase mixing circuit 110 according to an embodiment of the present disclosure.

Since the phase mixing circuit 120 may have substantially the same configuration, a separate description thereof will be omitted.

The phase mixing circuit 110 includes a jitter cancellation circuit 111 and a delay alignment circuit 112.

The jitter cancellation circuit 111 includes a first node N1, a second node N2, a third node N3, and a fourth node N4.

The first clock signal I is supplied to the first node N1, the second clock signal IB is supplied to the second node N2, and jitter-cancelled signals corresponding to first and second clock signal I and IB are respectively output from the third node N3 and the third node N4.

The jitter cancellation circuit 111 includes N+2n inverters connected in series between the first node N1 and the third node N3, and N+2n+1 inverters connected in series between the first node N1 and the fourth node N4, N+2n−1 inverters connected between the second node N2 and the third node N3, and N+2n inverters connected in series between the second node N2 and the fourth node N4, where N is an integer greater than or equal to 0, and n is a natural number greater than or equal to 1. In FIG. 2, N is 0 and n is 1.

Various embodiments of the delay adjustment circuit 112 are possible. The delay adjustment circuit 112 shown in FIG. 2 further performs a skew correction function.

The delay adjustment circuit 112 is connected to the third node N3 and the fourth node N4 and includes a fifth node N5 and a sixth node N6.

The first output clock signal $I_{OUT}$ is output from the fifth node N5, and the second output clock signal $IB_{OUT}$ is output from the sixth node N6.

The delay adjustment circuit 112 includes M+2m−1 inverters connected in series between the third node N3 and the fifth node N5, and M+2m inverters connected in series between the third node N3 and the sixth node N6, M+2m inverters connected in series between the fourth node N4 and the fifth node N5, and M+2m−1 inverters connected in series between the fourth node N4 and the sixth node N6, where M is an integer greater than or equal to 0, and m is a natural number greater than or equal to 1. In FIG. 2, M is 0 and m is 1.

In an embodiment, each of the inverters illustrated in FIG. 2 have the same inverter delay $t_{INV}$.

Figure 3:
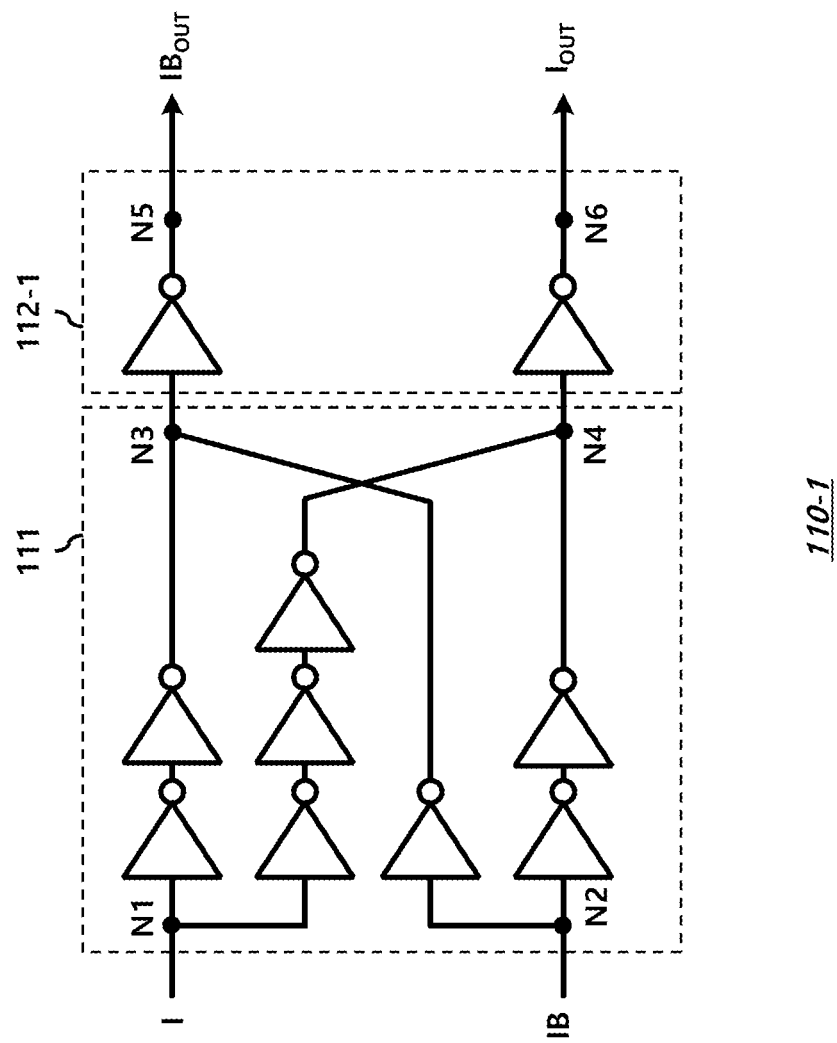
FIG. 3 illustrates a phase mixing circuit according to another embodiment of the present disclosure.

FIG. 3 shows a phase mixing circuit 110-1 according to another embodiment of the present disclosure.

The jitter cancellation circuit 111 of FIG. 3 is the same as the jitter cancellation circuit 111 of FIG. 2. The delay adjustment circuit 112-1 of FIG. 3 simply adjusts the delay amount, unlike the delay adjustment circuit 112 of FIG. 2.

The delay adjustment circuit 112-1 includes an inverter connected between the third node N3 and the fifth node N5, and another inverter connected between the fourth node N4 and the sixth node N6.

However, since the phase of the signal is different, the second output clock signal $IB_{OUT}$ is output from the fifth node N5 and the first output clock signal $I_{OUT}$ is provided from the sixth node N6.

Those skilled in the art will be able to make various design changes from the embodiments of FIGS. 2 and 3, and further detailed disclosure will be omitted.

The operation of the phase mixing circuit 110 is described in detail below.

Figure 4:
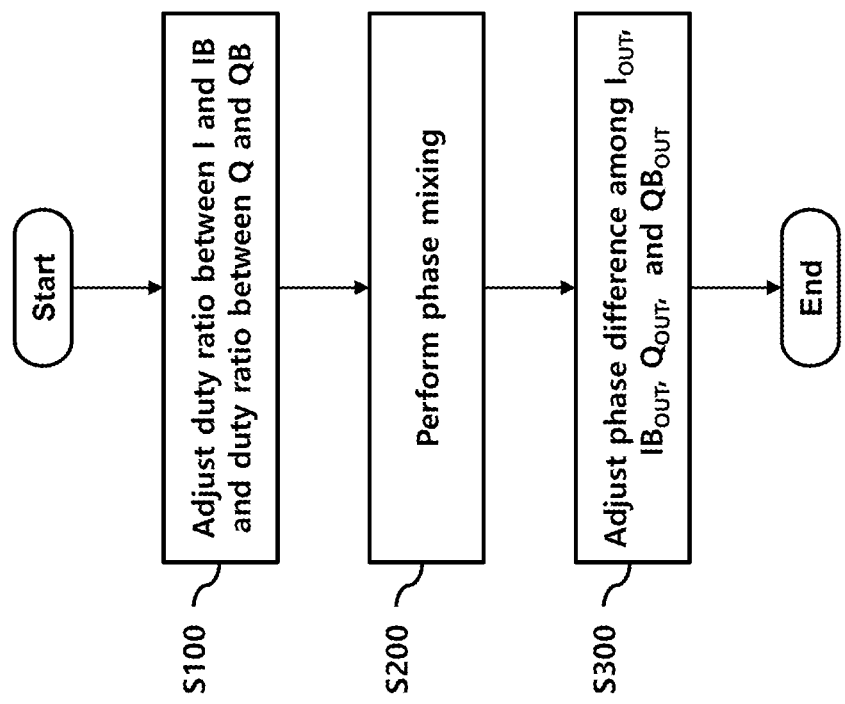
FIG. 4 is a flowchart illustrating an operation of a multi-phase clock signal alignment circuit according to an embodiment of the present disclosure.

FIG. 4 is a flowchart illustrating an operation of the multi-phase clock signal alignment circuit 1 according to an embodiment of the present disclosure.

The multi-phase clock signal alignment circuit 1 first adjusts a first duty ratio between the first clock signal I and the second clock signal IB and a second duty ratio between the third clock signal Q and the fourth clock signal QB at S100. Hereinafter, this is referred to as a duty ratio adjustment operation.

The multi-phase clock signal alignment circuit 1 performs a phase mixing operation using the first to fourth clock signals I, IB, Q, and QB at S200.

The multi-phase clock signal alignment circuit 1 adjusts the phase difference between the first to fourth output clock signals TOUT, $IB_{OUT}$, $Q_{OUT}$, and $QB_{OUT}$ at S300. Hereinafter, this is referred to as a phase difference adjustment operation.

Figure 5:
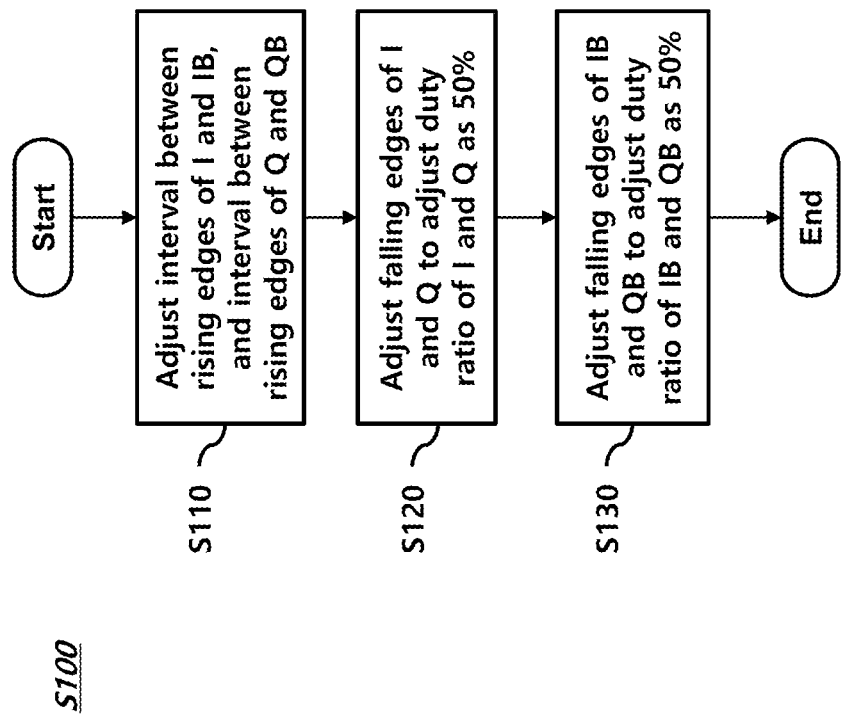
FIG. 5 is a flowchart illustrating a duty ratio adjustment operation according to an embodiment of the present disclosure.

FIG. 5 is a flowchart illustrating the duty ratio adjustment operation S100 of FIG. 4.

First, a first interval between rising edges of the first clock signal I and the second clock signal IB is adjusted, and a second interval between rising edges of the third clock signal Q and the fourth clock signal QB is adjusted at S110.

Next, the duty ratio of the first clock signal I and the third clock signal Q is set to 50% by adjusting timings of respective falling edges of the first clock signal I and the third clock signal Q at S120.

Next, the duty ratio of the second clock signal IB and the fourth clock signal QB is set to 50% by adjusting timings of respective falling edges of the second clock signal QB and the fourth clock signal QB at S130.

Figure 6A:
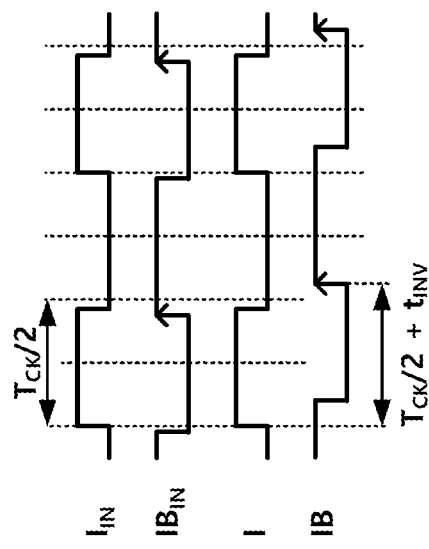
FIGS. 6A, 6B, and 6C are timing diagrams illustrating a duty ratio adjustment operation according to an embodiment of the present disclosure.
Figure 6B:
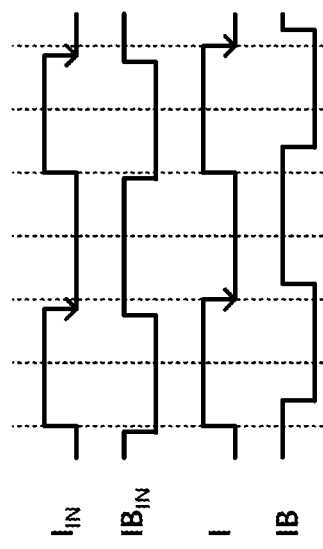
Figure 6C:
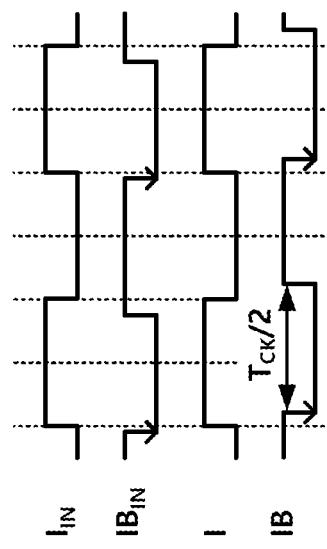

FIGS. 6A, 6B, and 6C are timing diagrams illustrating the duty ratio adjustment operation shown in FIG. 5.

FIG. 6A corresponds to S110 of FIG. 5.

The phase control circuit 20 sets the selection signal SEL so that the clock selection circuit 30 selects the first clock signal I and the second clock signal IB.

The first clock signal I is delayed by $T_{CK}/2+t_{INV}$ by the delay circuit 41 to be provided as the first selection clock signal CK1, and the second clock signal IB is provided as the second selection clock signal CK2.

Here, $T_{CK}$ is the period of a multi-phase clock signal, and $t_{INV}$ corresponds to one inverter delay as described above. In a circuit receiving the multi-phase clock signal that includes an embodiments of the present disclosure, $T_{CK}$ may, for example, be determined using a clock regeneration circuit such as is known in the related art.

The phase detection circuit 50 generates a phase detection signal PD by detecting a phase difference between rising edges of the first selection clock signal CK1 and the second selection clock signal CK2.

The phase control circuit 20 controls the phase delay circuit according to the phase detection signal PD.

In the illustrated embodiment of S110 of FIG. 5, the phase delay circuit 12 is controlled according to the control of the phase control circuit 20 to adjust the delay amount of a rising edge of the corresponding input clock signal.

As a result, the phase control circuit 20 controls so that the interval between rising edges of the first clock signal I and the second clock signal IB becomes $T_{CK}/2+t_{INV}$.

In the jitter cancellation circuit 111, time delay between the first node N1 and the third node N3 corresponds to twice the inverter delay, and time delay between the second node N2 and the third node N3 corresponds to one inverter delay.

Since the first clock signal I is applied to the first node N1 and the second clock signal IB is input to the second node N2, as a result, delay in a path from the first node N1 to the third node N3 and delay in a path from the second node N2 to the third node N3 becomes the same.

Similar operations to the above are repeated in S110 for the third clock signal Q and the fourth clock signal QB.

To this end, the phase control circuit 20 sets the selection signal SEL so that the clock selection circuit 30 selects the third clock signal Q and the fourth clock signal QB.

The third clock signal Q is delayed by $T_{CK}/2+t_{INV}$ by the delay circuit 41 to produce the first selection clock signal CK1, and the fourth clock signal QB is provided as the fourth selection clock signal CK2.

The phase detection circuit 50 generates a phase detection signal PD by detecting a phase difference between rising edges of the first selection clock signal CK1 and the second selection clock signal CK2.

The phase control circuit 20 controls the phase delay circuit 14 to adjust delay amount of a rising edge of the corresponding input clock signal.

As a result, the phase control circuit 20 controls so that the interval between the rising edges of the third clock signal Q and the fourth clock signal QB becomes $T_{CK}/2+t_{INV}$.

FIG. 6B corresponds to step S120 of FIG. 5.

First, a delay amount of a falling edge of the first clock signal I is adjusted to control a duty ratio to be 50%. For this, the following operation is performed.

The phase control circuit 20 sets the selection signal SEL so that the clock selection circuit 30 selects the first clock signal I and the second clock signal IB.

The first clock signal I passes through one inverter in the delay circuit 41, that is, is delayed by $t_{INV}$ and is provided as the first selection clock signal CK1, and the second clock signal IB is provided as the second selection clock signal CK2. The first selection clock signal CK1 corresponds to an inversion of the first clock signal I. Therefore, in this case the first selection clock signal CK1 may be represented as an inverted first clock signal.

The phase detection circuit 50 generates a phase detection signal PD by detecting a phase difference between rising edges of the first selection clock signal CK1 and the second selection clock signal CK2.

The phase control circuit 20 controls the phase delay circuit 11 to adjust the delay amount of a falling edge of the first input clock signal I.

Since the delay amount of one inverter corresponds to one inverter delay $t_{INV}$, when the adjustment of the delay amount of the falling edge of the first input clock signal I causes a rising edge of the inverted first clock signal (i.e., of the first selection clock signal CK1) and a rising edge of the second clock signal IB (i.e., of the second selection clock signal CK2) to be aligned, as a result, the duty ratio of the first clock signal I is set to 50%.

Next, a delay amount of a falling edge of the third clock signal Q is adjusted to control the duty ratio to be 50%. For this, the following operation is performed.

The phase control circuit 20 sets the selection signal SEL so that the clock selection circuit 30 selects the third clock signal Q and the fourth clock signal QB.

The third clock signal Q passes through one inverter in the delay circuit 41, that is, is delayed by $t_{INV}$ and is provided as the first selection clock signal CK1, and the fourth clock signal QB is provided as the second selection clock signal CK2. The first selection clock signal CK1 corresponds to an inversion of the third clock signal Q. Therefore, in this case the first selection clock signal CK1 may be represented as an inverted third clock signal.

The phase detection circuit 50 generates a phase detection signal PD by detecting a phase difference between rising edges of the first selection clock signal CK1 and the second selection clock signal CK2.

The phase control circuit 20 controls the phase delay circuit 13 to adjust delay amount of a falling edge of the third clock signal Q.

Since the delay amount of one inverter corresponds to the inverter delay $t_{INV}$, when the adjustment of the delay amount of the falling edge of the third input clock signal Q causes a rising edge of the inverted third clock signal (i.e., of the first selection clock signal CK1) and a rising edge of the fourth clock signal QB (i.e., of the second selection clock signal CK2) to be aligned, the duty ratio of the third clock signal Q is set to 50%.

FIG. 6C corresponds to step S130 of FIG. 5.

First, by adjusting a delay amount of a falling edge of the second clock signal IB, the duty ratio is controlled to be 50%. For this, the following operation is performed.

The phase control circuit 20 sets the selection signal SEL so that the clock selection circuit 30 selects the first clock signal I and the second clock signal IB.

The first clock signal I passes through two inverters in the delay circuit 41, that is, is delayed by $2t_{INV}$, and is provided as the first selection clock signal CK1, and the second clock signal IB passes through one inverter in the delay circuit 42, that is, is delayed by $t_{INV}$, and is provided as the second selection clock signal CK2.

The phase detection circuit 50 generates a phase detection signal PD by detecting a phase difference between falling edges of the first selection clock signal CK1 and the second selection clock signal CK2.

The phase control circuit 20 controls the phase delay circuit 12 to adjust the delay amount of a falling edge of the second clock signal IB.

Accordingly, when the adjustment of the delay amount of the falling edge of the second clock signal IB causes a rising edge of the first clock signal I passing through two inverters (i.e., of the first selection clock signal CK1) to be aligned with a rising edge of the second clock signal IB passing through one inverter (i.e., of the second selection clock signal CK2), the duty ratio of the second clock signal IB is set to 50%.

Next, a delay amount of a falling edge of the fourth clock signal QB is adjusted to control duty ratio to be 50%. For this, the following operation is performed.

The phase control circuit 20 sets the selection signal SEL so that the clock selection circuit 30 selects the third clock signal Q and the fourth clock signal QB.

The third clock signal Q passes through two inverters in the delay circuit 41, that is, is delayed by $2t_{INV}$ and is provided as the first selection clock signal CK1, and the fourth clock signal QB passes through one inverter in the delay circuit 42, that is, is delayed by $t_{INV}$, and is provided as the second selection clock signal CK2.

The phase detection circuit 50 generates a phase detection signal PD by detecting a phase difference between falling edges of the first selection clock signal CK1 and the second selection clock signal CK2.

The phase control circuit 20 controls the phase delay circuit 14 to adjust the delay amount of a falling edge of the fourth clock signal QB.

Accordingly, when the adjustment of the delay amount of the falling edge of the fourth clock signal QB causes a rising edge of the third clock signal Q passing through two inverters (i.e., of the first selection clock signal CK1) to be aligned with a rising edge of the fourth clock signal QB passing through one inverter (i.e., of the second selection clock signal CK2), the duty ratio of the fourth clock signal QB is set to 50%.

Figures 7A, 7B:
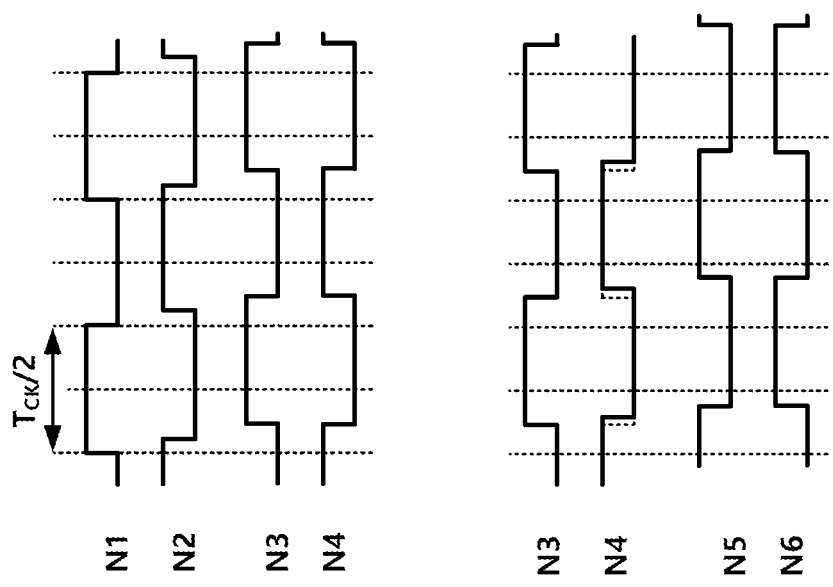
FIGS. 7A and 7B are timing diagrams illustrating a phase mixing operation according to an embodiment of the present disclosure.

FIGS. 7A and 7B are timing diagrams illustrating a phase mixing operation S200 of FIG. 4 according to an embodiment of the present disclosure.

The phase mixing circuit 110 of FIG. 2 performs a phase mixing operation at S200.

The phase mixing circuit 110 may perform a jitter cancellation operation and may further perform a skew removal operation.

The first clock signal I is input to the first node N1 of the jitter cancellation circuit 111, and the second clock signal IB is input to the second node N2 of the jitter cancellation circuit 111.

As described above, a rising edge of the second clock signal IB is delayed by a sum of one inverter delay $t_{INV}$ and a half period $T_{CK}/2$ of the multi-phase clock signal from a rising edge of the first clock signal I.

If duty ratios of the first clock signal I and the second clock signal IB are each adjusted to be 50%, a falling edge of the second clock signal IB is delayed by a sum of one inverter delay $t_{INV}$ and a half period $T_{CK}/2$ of a multi-phase clock signal from a falling edge of the first clock signal I.

Accordingly, phase of a signal at the third node N3 may be aligned as follows.

A rising edge of the first clock signal I provided to the third node N3 through the first node N1 and a falling edge of the second clock signal IB provided to the third node N3 through the second node N2 corresponds to a rising edge of a signal at the third node N3, and delay time becomes equal to $2t_{INV}$, so that phases thereof can be aligned.

In addition, a falling edge of the first clock signal I provided to the third node N3 through the first node N1 and a rising edge of the second clock provided to the third node N3 through the second node N2 correspond to a falling edge of a signal at the third node N3, and delay time becomes equal to $2t_{INV}$, so that phases thereof can be aligned.

Also, phase of the signal at the fourth node N4 may be aligned as follows.

A falling edge of the first clock signal I provided to the fourth node N4 through the first node N1 and a rising edge of the second clock signal IB provided to the fourth node N4 through the second node N2 corresponds to a rising edge of a signal at the fourth node N4, and the delay time becomes equals to $3t_{INV}$, so that the phases may be aligned. In addition, a falling edge of the first clock signal I provided to the fourth node N4 through the first node N1 and a rising edge of the second clock signal IB provided to the fourth node N4 through the second node N2 corresponds to a falling edge of a signal at the fourth node N4, and the delay time become equals to $3t_{INV}$, so that the phases may be aligned.

The jitter of a signal output from the jitter cancellation circuit 111 is reduced compared to a signal input to the jitter cancellation circuit 111.

The jitter reduction effect depends on the phase difference and the correlation between two input signals.

If the phase difference between the two signals is large or the correlation is high, jitter reduction effect is low.

The correlation depends on noises such as power noise, flicker noise, and thermal noise. As noise increases, correlation between the two input signals decreases and the jitter reduction effect achieved by embodiments increases.

Table 1 compares the jitter reduction effect of an embodiment according to a correlation between the first clock signal I and the second clock signal IB. The frequency of the multi-phase clock signals used in the experiment was 5 GHz.

TABLE 1

| | RMS jitter (ps) | | |
|---|---|---|---|
| Node | correlation = 0 | 0 < correlation < 1 | correlation = 1 |
| N1 | 1.34 | 1.34 | 1.3 |
| N2 | 1.30 | 1.30 | 1.28 |
| N3 | 0.9 | 1.25 | 1.28 |
| N4 | 0.89 | 1.24 | 1.27 |

When correlation between the first clock signal I and the second clock signal IB is 0, that is, when noise applied to the two signals is completely different and there is no correlation between the two signals, jitter reduction effect is about 30%.

When correlation between the first clock signal I and the second clock signal IB is 1, that is, when noise applied to the two signals is the same and correlation between the two signals is 100%, the jitter reduction effect is insignificant.

When correlation between the first clock signal I and the second clock signal IB is greater than 0 and less than 1, a jitter reduction effect is about 6%.

Table 2 compares jitter reduction effect according to an additional phase difference between the first clock signal I and the second clock signal IB.

The additional phase difference represents a phase difference added to sum of a half period of a clock signal and one inverter delay $t_{INV}$, which is the phase difference between rising edges of the first and second clock signals I and IB.

TABLE 2

| Additional phase difference (ps) | RMS jitter reduction rate (%) |
|---|---|
| 0 | 29.5 |
| 2 | 28.5 |
| 4 | 26.3 |
| 6 | 23.4 |
| 8 | 20.5 |
| 16 | 12.5 |

Rising edges of the signals output from the third node N3 and the fourth node N4 of the jitter cancellation circuit 111 have a delay difference corresponding to the sum of one inverter delay and the half period of the clock signal.

Accordingly, a delay adjustment circuit 112 is further included at the rear end of the jitter cancellation circuit 111.

Since the configuration of the delay adjustment circuit 112 has been disclosed with reference to FIGS. 2 and 3, a repeated description thereof will be omitted.

Figure 8A:
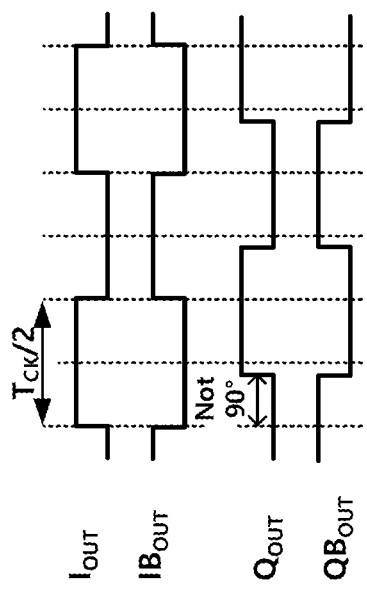
FIGS. 8A and 8B are timing diagrams illustrating a phase alignment operation according to an embodiment of the present disclosure.
Figure 8B:
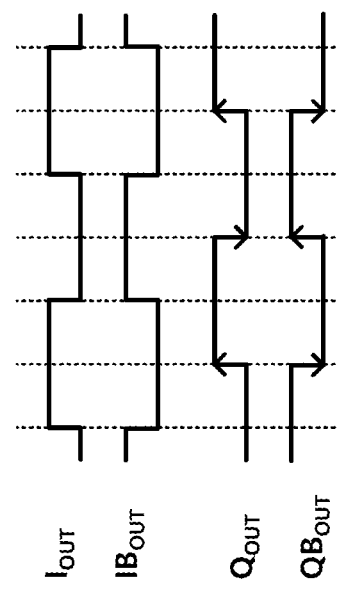

FIGS. 8A and 8B are timing diagrams illustrating a phase adjustment operation according to an embodiment of the present disclosure, such as may be performed in S300 of FIG. 4.

The duty ratio and the skew between the first clock signal I and the second clock signal IB and duty ratio and skew between the third clock signal Q and the fourth clock signal QB are completely adjusted by the duty ratio adjustment operation performed in S100 of FIG. 4 and the operation of the phase mixing circuit 100 in S200 of FIG. 4.

However, as shown in FIG. 8A, the phase difference between the first output clock signal $I_{OUT}$ and the third output clock signal $Q_{OUT}$ and the second output clock signal $IB_{OUT}$ and the fourth output clock signal $QB_{OUT}$ may not be 90 degrees. In this case, an additional phase control operation such as S300 of FIG. 4 may be required.

For the phase control operation, the clock selection circuit 30 selects the first output clock signal $I_{OUT}$ and the third output clock signal $Q_{OUT}$.

The delay circuit 41 outputs a signal corresponding to a delay of the first output clock signal $I_{OUT}$ by $T_{CK}/4$ as the first selection clock signal CK1, and the delay circuit 42 outputs a signal corresponding to the third output clock signal $Q_{OUT}$ as the second selection clock signal CK2.

The phase detection circuit 50 detects a phase difference between rising edges of the first selection clock signal CK1 and the second selection clock signal CK2.

The phase control circuit 20 adjusts a delay amount of the delay control circuit 13 according to the phase detection signal PD until the rising edges of the first selection clock signal CK1 and the second selection clock signal CK2 are aligned.

At this time, the adjustment of the delay amount of the delay control circuit 13 adjusts the delays of a rising edge and a falling edge of a clock signal to the same extent so that the entire clock signal is delayed.

Subsequently, the clock selection circuit 30 selects the second output clock signal $IB_{OUT}$ and the fourth output clock signal $QB_{OUT}$.

The delay circuit 41 delays the second output clock signal $IB_{OUT}$ by $T_{CK}/4$ and outputs it as the first selection clock signal CK1, and the delay circuit 42 outputs the fourth output clock signal $QB_{OUT}$ as the second selection clock signal CK2.

The phase detection circuit 50 detects a phase difference between rising edges of the first selection clock signal CK1 and the second selection clock signal CK2.

The phase control circuit 20 adjusts a delay amount of the delay control circuit 14 according to the phase detection signal until the rising edges of the first selection clock signal CK1 and the second selection clock signal CK2 are aligned.

At this time, the adjustment of the delay amount of the delay control circuit 14 adjust the delays of a rising edge and a falling edge of the clock signal to the same extent so that the entire clock signal is delayed.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A phase mixing circuit comprising:
    a jitter cancellation circuit configured to mix phases of a first signal input to a first node and a second signal input to a second node to produce a third signal at a third node and a fourth signal at a fourth node; and
    a delay adjustment circuit configured to adjust respective delays of the third signal and the fourth signal to produce a fifth signal at a fifth node and a sixth signal at a sixth node,
    wherein the jitter cancellation circuit comprises:
        N+2n inverters connected in series between the first node and the third node;
        N+2n+1 inverters connected in series between the first node and the fourth node;
        N+2n−1 inverters connected in series between the second node and the third node; and
        N+2n inverters connected in series between the second node and the fourth node,
        wherein N is an integer greater than or equal to 0 and n is a natural number.

2. The phase mixing circuit of claim 1, wherein a phase difference between the first signal and the second signal corresponds to a sum of a half period of the first signal and a delay amount of an inverter of the phase mixing circuit.

3. The phase mixing circuit of claim 1, wherein the delay adjustment circuit comprises:
    M+2m−1 inverters connected in series between the third node and the fifth node;
    M+2m inverters connected in series between the third node and the sixth node;
    M+2m inverters connected in series between the fourth node and the fifth node; and
    M+2m−1 inverters connected in series between the fourth node and the sixth node,
    wherein M is an integer greater than or equal to 0 and m is a natural number.

4. A multi-phase clock signal alignment circuit comprising:
    a plurality of phase delay circuits configured to control delays of a plurality of multi-phase input clock signals to produce a plurality of multi-phase clock signals, respectively;
    a plurality of phase mixing circuits configured to mix phases of the multi-phase clock signals to produce multi-phase output clock signals;
    a clock selection circuit configured to select alpha and beta clock signals from among the multi-phase clock signals or from among the multi-phase output clock signals;
    a first clock delay circuit configurable to provide a first selection clock signal by outputting the alpha clock signal and configurable to provide the first selection clock signal by adjusting a delay, a phase, both of the alpha clock signal;
    a second clock delay circuit configurable to provide a second selection clock signal by outputting the beta clock signal and configurable to provide the second selection clock signal by adjusting a delay, a phase, or both of the beta clock signal;
    a phase detection circuit configured to detect a phase difference between the first selection clock signal and the second selection clock signal; and
    a phase control circuit configured to control the delays of the plurality of the phase delay circuits according to an output of the phase detection circuit.

5. The multi-phase clock signal alignment circuit of claim 4, wherein each of the plurality of phase mixing circuit includes:
    a jitter cancellation circuit configured to mix phases of a first signal input to a first node and a second signal input to a second node and to produce a third signal at a third node and a fourth signal at a fourth node; and
    a delay adjustment circuit configured to adjust delays of the third signal and the fourth signal to produce a fifth signal at a fifth node and a sixth signal at a sixth node.

6. The multi-phase clock signal alignment circuit of claim 5, wherein the jitter cancellation circuit comprises:
    N+2n inverters connected in series between the first node and the third node;
    N+2n+1 inverters connected in series between the first node and the fourth node;
    N+2n−1 inverters connected in series between the second node and the third node; and
    N+2n inverters connected in series between the second node and the fourth node,
    wherein N is an integer greater than or equal to 0 and n is a natural number.

7. The multi-phase clock signal alignment circuit of claim 6, wherein the delay adjustment circuit comprises:
    M+2m−1 inverters connected in series between the third node and the fifth node;
    M+2m inverters connected in series between the third node and the sixth node;
    M+2m inverters connected in series between the fourth node and the fifth node; and
    M+2m−1 inverters connected in series between the fourth node and the sixth node,
    wherein M is an integer greater than or equal to 0 and m is a natural number.

8. The multi-phase clock signal alignment circuit of claim 6, wherein the multi-phase clock signals are four-phase clocks signals including a first clock signal, a second clock signal, a third clock signal, and a fourth clock signal,
    wherein the second clock signal has an opposite phase to the first clock signal, the third clock signal has a phase delayed by 90 degrees from a phase of the first clock signal, and the fourth clock signal has an opposite phase to the third clock signal,
    wherein the plurality of phase mixing circuits includes:

a first phase mixing circuit configured to receive the first clock signal and the second clock signal and to generate a first output clock signal and a second output clock signal, and a second phase mixing circuit configured to receive the third clock signal and the fourth clock signal and to generate a third output clock signal and a fourth output clock signal.

9. The multi-phase clock signal alignment circuit of claim 8, wherein the multi-phase clock signal alignment circuit is configured to perform, using the phase control circuit:

a duty ratio adjustment operation wherein a first duty ratio between the first clock signal and the second clock signal is adjusted and a second duty ratio between the third clock signal and the fourth clock signal is adjusted, and a phase adjustment operation wherein a phase difference among the first output clock signal, the second output clock signal, the third output clock signal, and the fourth output clock signal is adjusted.

10. The multi-phase clock signal alignment circuit of claim 9, wherein the duty ratio adjustment operation comprises:

a first operation comprising controlling an interval between the first clock signal and the second clock signal and an interval between the third clock signal and the fourth clock signal to be a first interval corresponding to a sum of half a period of the first clock signal and a delay amount of m inverters, a second operation comprising controlling a falling edge of the first clock signal and a falling edge of the third clock signal to adjust duty ratios of the first clock signal and the third clock signal, and a third operation comprising controlling a falling edge of the second clock signal and a falling edge of the fourth clock signal to adjust duty ratios of the second clock signal and the fourth clock signal.

11. The multi-phase clock signal alignment circuit of claim 10, wherein during the first operation:

the clock selection circuit selects the first clock signal as the alpha clock signal and the second clock signal as the beta clock signal, the first clock delay circuit provides the first selection clock signal by outputting the alpha clock signal delayed by the first interval, the second clock delay circuit provides the second selection clock signal by outputting the beta clock signal, the phase detection circuit detects a first phase difference between a rising edge of the first selection clock signal and a rising edge of the second selection clock signal, and the phase control circuit controls a first phase delay circuit so that a rising edge of the second clock signal is adjusted according to the first phase difference.

12. The multi-phase clock signal alignment circuit of claim 11, wherein during a first portion of the second operation:

the clock selection circuit selects the first clock signal as the alpha clock signal and the second clock signal as the beta clock signal, the first clock delay circuit provides the first selection clock signal by outputting the alpha clock signal passed through one inverter, the second clock delay circuit provides the second selection clock signal by outputting the beta clock signal, the phase detection circuit detects a second phase difference between a rising edge of the first selection clock signal and a rising edge of the second selection clock signal, and the phase control circuit controls a second phase delay circuit so that a falling edge of the first clock signal is adjusted according to the second phase difference.

13. The multi-phase clock signal alignment circuit of claim 12, wherein during a second portion of the second operation:

the clock selection circuit selects the third clock signal as the alpha clock signal and the fourth clock signal as the beta clock signal, the first clock delay circuit provides the first selection clock signal by outputting the alpha clock signal passed through the one inverter, the second clock delay circuit provides the second selection clock signal by outputting the beta clock signal, the phase detection circuit detects a third phase difference between a rising edge of the first selection clock signal and a rising edge of the second selection clock signal, and the phase control circuit controls a third phase delay circuit so that a falling edge of the third clock signal is adjusted according to the third phase difference.

14. The multi-phase clock signal alignment circuit of claim 9, wherein during the phase adjustment operation:

the clock selection circuit selects the first clock signal as the alpha clock signal and the third clock signal as the beta clock signal, the first clock delay circuit provides the first selection clock signal by outputting the alpha clock signal delayed by a second interval corresponding to a quarter of the period of the first clock signal, the second clock delay circuit provides the second selection clock signal by outputting the beta clock signal, the phase detection circuit detects a phase difference between a rising edge of the first selection clock signal and the second selection clock signal, and the phase control circuit controls a corresponding phase delay circuit so that a rising edge of the third clock signal is adjusted according to the phase difference.

* * * * *